United States Patent
Schmidhammer

(10) Patent No.: US 12,395,153 B2
(45) Date of Patent: Aug. 19, 2025

(54) SPLIT-TYPE, HALF-LATTICE MICRO-ACOUSTIC FILTER USING A PHASE SHIFTER AND HAVING BROAD BANDWIDTH

(71) Applicant: RF360 Singapore Pte. Ltd., Republic Plaza (SG)

(72) Inventor: Edgar Schmidhammer, Munich (DE)

(73) Assignee: RF360 Singapore Pte. Ltd., Republic Plaza (SG)

( * ) Notice: Subject to any disclaimer, the term of this patent is extended or adjusted under 35 U.S.C. 154(b) by 463 days.

(21) Appl. No.: 17/288,410

(22) PCT Filed: Nov. 27, 2019

(86) PCT No.: PCT/EP2019/082682
§ 371 (c)(1),
(2) Date: Apr. 23, 2021

(87) PCT Pub. No.: WO2020/114849
PCT Pub. Date: Jun. 11, 2020

(65) Prior Publication Data
US 2021/0384890 A1    Dec. 9, 2021

(30) Foreign Application Priority Data
Dec. 5, 2018    (DE) ............ 10 2018 131 054.4

(51) Int. Cl.
*H03H 9/64*        (2006.01)
*H03H 7/12*        (2006.01)
(Continued)

(52) U.S. Cl.
CPC ............ *H03H 9/6406* (2013.01); *H03H 7/12* (2013.01); *H03H 7/19* (2013.01); *H03H 7/38* (2013.01); *H03H 9/6433* (2013.01)

(58) Field of Classification Search
CPC ...... H03H 9/6406; H03H 9/6433; H03H 7/12; H03H 7/19; H03H 7/38
See application file for complete search history.

(56) References Cited

U.S. PATENT DOCUMENTS

| 1,994,658 A | 3/1935 | Marrison |
| 2,001,387 A | 5/1935 | Hansell |

(Continued)

FOREIGN PATENT DOCUMENTS

| CN | 1711681 A | 12/2005 |
| CN | 101084623 A | 12/2007 |

(Continued)

OTHER PUBLICATIONS

Fattinger G.G., et al., "Optimization of Acoustic Dispersion for High Performance Thin Film BAW Resonators", IEEE Ultrasonics Symposium, vol. 2, 2005, pp. 1175-1178, XP010899034, section II.

(Continued)

*Primary Examiner* — Samuel S Outten
(74) *Attorney, Agent, or Firm* — Polsinelli

(57) ABSTRACT

A micro-acoustic RF filter comprises first and second ports (101, 102). First and a second signal paths (120, 110) are coupled between the first and second ports and include a corresponding resonator (111, 121). The resonator of at least one of the signal paths is a micro-acoustic resonator. One of the signal paths includes also a phase shifter (232) serially connected with the resonator (111). The micro-acoustic RF filter achieves a broad passband determined by the resonance frequencies of the micro-acoustic resonators. The filter allows flexible adaption of the passband and stopband performance.

20 Claims, 7 Drawing Sheets

(51) Int. Cl.
  *H03H 7/19* (2006.01)
  *H03H 7/38* (2006.01)

(56) References Cited

U.S. PATENT DOCUMENTS

| | | | |
|---|---|---|---|
| 3,416,104 | A | 12/1968 | Evangelos et al. |
| 5,093,638 | A | 3/1992 | Kinsman et al. |
| 5,499,002 | A | 3/1996 | Kinsman |
| 2002/0093394 | A1 | 7/2002 | Tikka et al. |
| 2003/0042995 | A1 | 3/2003 | Ella |
| 2008/0055020 | A1 | 3/2008 | Handtmann et al. |
| 2011/0128092 | A1 | 6/2011 | Fritz et al. |
| 2011/0187478 | A1 | 8/2011 | Link et al. |
| 2011/0193656 | A1 | 8/2011 | Erb et al. |
| 2015/0035599 | A1 | 2/2015 | Chow et al. |
| 2015/0372658 | A1* | 12/2015 | Zhang ............... H03H 9/605 333/129 |
| 2016/0118956 | A1 | 4/2016 | Kihara et al. |
| 2016/0359469 | A1 | 12/2016 | Ella et al. |
| 2018/0131344 | A1* | 5/2018 | Komatsu ............ H03H 9/0014 |
| 2020/0136588 | A1* | 4/2020 | Alicioglu ............ H04B 1/1036 |
| 2020/0153412 | A1* | 5/2020 | Nosaka ............... H03H 9/703 |

FOREIGN PATENT DOCUMENTS

| | | |
|---|---|---|
| CN | 102497172 A | 6/2012 |
| JP | 2008312146 A | 12/2008 |
| WO | 2012084461 A1 | 6/2012 |

OTHER PUBLICATIONS

International Search Report and Written Opinion—PCT/EP2019/082682—ISA/EPO—Feb. 17, 2020.
Xiao-Ming T., et al., "Design and Simulation of a Bulk Acoustic Wave Filters", Information and Electronic Engineering, vol. 4, No. 2, Jun. 30, 2006, pp. 157-160.

\* cited by examiner

SPLIT-TYPE, HALF-LATTICE MICRO-ACOUSTIC FILTER USING A PHASE SHIFTER AND HAVING BROAD BANDWIDTH

TECHNICAL FIELD

The present disclosure relates to RF filters. Specifically, the present disclosure relates to a RF filter that comprises micro-acoustic resonators.

BACKGROUND

RF filters are widely used in electronic devices to select the wanted signal bandwidth from the received signal. RF filters in communication devices covering currently serviced transmission bands are often composed of surface acoustic wave resonators or bulk acoustic wave resonators in ladder-type structures.

In a ladder-type RF filter, the bandwidth is mainly determined by the distance between resonance and anti-resonance frequencies or pole-zero-distance which is mainly determined by the coupling factor of the piezoelectric substrate of the resonators. The use of passive components such as inductors in the ladder-type structure may increase the bandwidth, however, at the cost of overall filter performance such as poor out-of-band attenuation. Other approaches relate to a scandium doping of an aluminum nitride piezoelectric layer to increase the acoustic coupling which improves the bandwidth of ladder-type filters. However, the fabrication of aluminum scandium nitride piezoelectric layers is complex and the amount of scandium is physically limited to about 40% within the aluminum nitride.

Other dopants to aluminum nitride or other piezoelectric materials or substrates can increase the physical bandwidth and the pole-zero distance, wherein the principle limitations remain.

Future broadband transmission standards such as the 5G communication standard require a broad passband of a filter with good out-of-band attenuation as other services may be close to the 5G bands. For example, a RF filter for the n79-band requires a passband width of 600 MHz from 4.4 GHz to 5.0 GHz, wherein a WLAN service is located immediately above the passband so that a filter must cover a broad passband and exhibit good out-of-band attenuation when both services shall be covered by the communication device simultaneously. These requirements may be contradictory for ladder-type filter structures so that it may be difficult to achieve all requirements with a current ladder-type design even using the approaches discussed above. Another prominent example is the n77-band, where the bandwidth spans 900 MHz from 3.0 GHz to 4.2 GHz, also with nearby selectivities required to allow for co-banding of 4G and 5G systems. Accordingly, there is a need for a micro-acoustic RF filter that provides a broad passband and good out-of-band attenuation. The RF filter should be less complex, enabling straightforward manufacturing.

It is an object of the present disclosure to provide a new structure for a micro-acoustic RF filter allowing a broad passband, steep filter skirts and good out-of-band attenuation.

It is another object of the present disclosure to provide such a micro-acoustic RF filter that can be manufactured with currently available technologies for both surface acoustic wave (SAW) and bulk acoustic wave (BAW) or film bulk acoustic resonator (FBAR) type resonators.

It is yet another object of the present disclosure to provide such a micro-acoustic RF filter that is less complex.

SUMMARY

According to the present disclosure, one or more of the above-mentioned objects is achieved by a micro-acoustic RF filter comprising the features of present claim 1.

According to embodiments of the present disclosure, a first and a second signal path are coupled between a first and a second port. Each signal path comprises a resonator. One of the first and second signal paths furthermore comprises a phase shifter connected in series with the resonator. Such a circuit structure employs a half-lattice filter. At least one of the resonators is a micro-acoustic resonator, wherein the other resonator may be a micro-acoustic resonator or a capacitor. In case that the resonators comprise a micro-acoustic resonator and a capacitor, spurious modes or other losses, that may affect or contaminate the passband behaviour, are reduced. When spurious modes and/or losses of a micro-acoustic resonator affect the passband, that micro-acoustic resonator should be replaced by a capacitor.

According to embodiments, the phase shifter is configured to perform a phase shift of 180° or of about 180°. Specifically, the phase shift may be 180° at least once within a passband of the filter. More than one 180° crossings of the phase shift function within the passband may also be possible. For example, the phase shifter may perform a phase shift of 180° at the center frequency of the passband bandwidth.

The phase shifter may be realized by various embodiments. Any embodiment that exhibits at least one phase shift of a value of 180° within the passband of the RF filter is possible. According to embodiments, the phase shifter may comprise a high pass Pi circuit, a low pass Pi circuit, a high pass Tee circuit, or a low pass Tee circuit. The phase shifter may also comprise compositions thereof to additionally shape the out-of-band behaviour of the filter. The phase shifter may also comprise corresponding higher order circuits, wherein the number of elements is larger than 3 (three). In addition allpass-topologies, which offer good insertion loss in a wide passband and allow to shape the phase, are useable as well. Equalizer circuits can be used also. Circuit representations of any of the above-mentioned phase shifter circuits are available to the skilled artisan.

The phase shifter may also be realized using so called hybrid circuits. According to embodiments, the phase shifter may comprise a 0°/180° 3 dB-hybrid circuit that is coupled between the first and second signal paths.

According to another embodiment, the phase shifter may comprise a 0°/90° 3 dB-hybrid circuit coupled between the first and second signal paths and a phase shifter configured to perform a phase shift of 90° or of about 90° so that in sum a phase shift of 180° or approximately 180° is achieved. Specifically, the phase shift may be 90° at least once within the passband of the RF filter. The 90° phase shift of the hybrid circuit and the 90° phase shift from the phase shifter circuit together form a 180° phase shift within one of the first and second signal paths.

The 180° phase shifter may also be realized as a power divider combined with a first and a second leg that have about 180° phase shift therebetween at least once within the passband of the RF filter. According to embodiments, the phase shifter may comprise a power divider that has first and second output terminals wherein a high pass filter is connected to one of the first and second output terminals and a low pass filter is connected to the other one of the first and second output terminals. Use of a power combiner may require additional phase-correction circuits to provide the 0°/180° phase-shift in the two legs of the half-lattice filter.

According to embodiments, a matching circuit may be connected between at least one of the first and second ports and the first and second signal paths. The matching circuit may comprise a series connected inductor or a series connected inductor together with a shunt connected capacitor such as a low pass type filter. The matching circuit allows the realization of a flat passband performance. Of course, other matching circuits as exemplary mentioned and familiar to those skilled in the art may be used as well.

Furthermore, the first and second ports of the RF filter should be matched to the external circuits coupled thereto. The half-lattice filter structure allows a relatively free dimensioning of the impedance matching circuits so that impedance matching of the first and second ports may achieve substantially different impedances. In an embodiment, the matching circuits may be formed such that the impedances of the first and second ports are substantially different. The presented half-lattice approach allows an impedance transformation from input to output of the filter.

The half-lattice filter structure allows a modification of the stopband and the skirts of the passband relatively independent from the passband so that the shaping of the stopband attenuation and the filter skirts does not substantially affect the passband attenuation. This is achieved with additional elements coupled to the first and/or second ports that provide a finite transmission zero (FTZ) function. The placement of FTZ is relatively independent, so the designer can choose of placing all of them at the input of the filter, all of them at the output of the filter or at both input and output of the filter. According to embodiments, at least one or more micro-acoustic resonators or one or more parallel resonance circuits are connected in series between the first and second paths and one of the first and second ports to perform a finite transmission zero function. According to embodiments, at least one or more micro-acoustic resonators or one or more series resonance circuits are connected in shunt to a node coupled between the first and second signal paths and one of the first and second ports to perform a finite transmission zero function. It must be understood that the placement of various FTZ may require additional elements such as inductors, capacitors to match properly between the FTZ. This is well known to those skilled in the art.

Cascading of resonators and phase shifters in the first and second signal paths to increase the filter degree is also possible. According to embodiments, at least one additional resonator is cascaded in each one of the first and second signal paths. Expanding the concept of cascading, at least one other additional resonator is cascaded in each one of the first and second signal paths together with an additional phase shifter that is configured to perform a phase shift of 180° at least once within the passband of the RF filter in the second signal path. All resonators involved in the cascaded half-lattice filter are allowed to have different properties such as resonance frequency, static capacitance, pole-zero-distance, manufacturing technology, etc.

According to embodiments, one or more or all of the micro-acoustic resonators are composed of an anti-series cascade of a first and a second resonator or an anti-parallel cascade of a first and a second resonator to improve the linearity of the filter, for example. The first and second resonators of the anti-series and the anti-parallel cascade exhibit an opposite piezoelectric polarity of the piezoelectric material of which they are composed relative to the applied electric field. In an anti-series cascade, said first and second resonators are serially connected such that the polarity of the piezoelectric material of said resonators has opposite orientation to a signal propagating through said first and second resonators, e.g. voltage, electric field at a certain time-stamp To. In an anti-parallel cascade, said first and second resonators are connected in parallel such that the polarity of the piezoelectric material of said resonators has opposite orientation to a signal propagating through said first and second resonators, e.g. voltage, electric field at a certain time-stap To.

In the RF filter circuit, the elements may be partitioned to different chips. A first chip may comprise the micro-acoustic resonators having a resonance frequency within or close to the passband of the RF filter. A second chip may comprise the micro-acoustic resonators having a resonance frequency that is substantially higher than the upper edge of the passband and a third chip may comprise micro-acoustic resonators having a resonance frequency substantially lower than the lower edge of the passband. Micro-acoustic resonators that have a resonance frequency close to the passband of the RF filter or the upper and lower edge of the passband may preferably be positioned on the first chip. In addition, additional chips or the filter laminate may comprise FTZ realized as series resonance circuits and/or parallel resonance circuits and optionally additional inductors and/or capacitors realized in any substrate-based technologies like laminate, passive-on-glass, low temperature co-fired ceramic (LTCC), any integrated-passive-devices (IPD) technology. Capacitors required for the phase-shifter realization may be included on the first chip in case they can be realized as on-chip capacitors on the SAW-substrate or BAW-substrate.

As an illustrative example the RF filter may be configured to exhibit a passband portion that is in the range between 4.4 GHz and 5.0 GHz forming the n79-band. The out-of-band portion of the filter is in a frequency range of lower than 4.4 GHz and beyond 5.0 GHz. The micro-acoustic resonators of the filter may be surface acoustic wave resonators only or bulk acoustic wave resonators only or may comprise surface acoustic wave resonators as well as bulk acoustic wave resonators, realized in various technology flavours and known under different names like $LiTaO_3$, High Q temperature-compensated filters (HQTCF), ThinFilm-SAW, SMR-BAW, FBAR, etc. The piezoelectric substrates may comprise lithium tantalate, lithium niobate, aluminum nitride or aluminum scandium nitride, or any other piezoelectric material allowing the realization of micro-acoustic resonators supporting either surface acoustic wave types or bulk acoustic wave types. MEMS based resonators are possible as well. Resonators using such piezoelectric materials and the half-lattice filter structure according to the embodiments described above are able to cover the relatively broad passband required for the n79-band and exhibit the steep filter skirts together with sufficient attenuation in the out-of-band portion to suppress other RF services located in a frequency band immediately adjacent to the n79-band. Another example is given by the n77-band, covering 900 MHz bandwidth (3300 MHz-4200 MHz) and requesting for co-existence between B42/B43 (included within the n77-band) and n79. The proposed half-lattice approach is a superior solution to fulfil the required customer specifications with standard micro-acoustic resonators.

It is to be understood that both the foregoing general description and the following detailed description are merely exemplary, and are intended to provide an overview or framework to understand the nature and character of the claims. The accompanying drawings are included to provide a further understanding and are incorporated in, and constitute a part of, this description. The drawings illustrate one or more embodiments, and together with the description serve to explain principles and operation of the various embodiments. The same elements in different figures of the drawings are denoted by the same reference signs.

DETAILED DESCRIPTION OF EMBODIMENTS

The present disclosure will now be described more fully hereinafter with reference to the accompanying drawings showing embodiments of the disclosure. The disclosure may, however, be embodied in many different forms and should not be construed as limited to the embodiments set forth herein. Rather, these embodiments are provided so that the disclosure will fully convey the scope of the disclosure to those skilled in the art. The drawings are not necessarily drawn to scale but are configured to clearly illustrate the disclosure.

Figure 1:
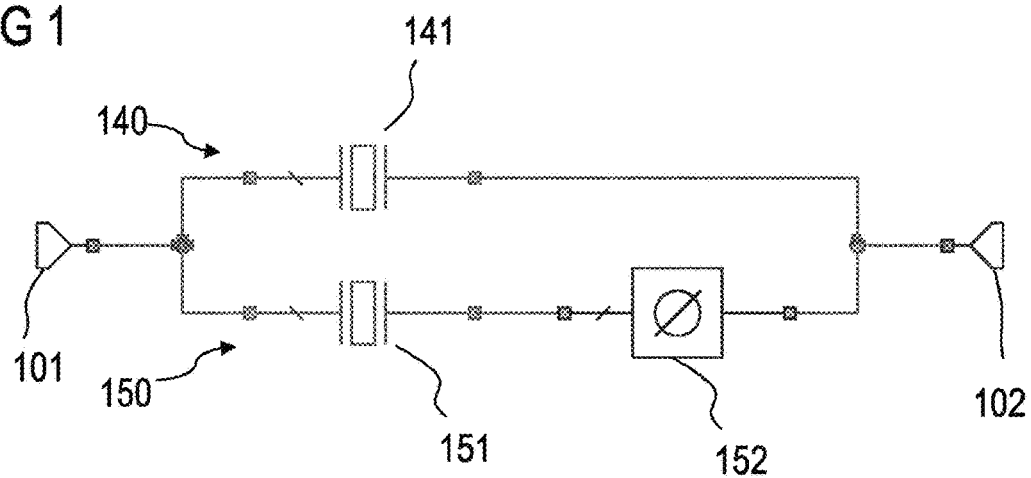
FIG. 1 shows a schematic diagram of a RF filter of the half-lattice type according to the principles of the present disclosure.

FIG. 1 shows a principle embodiment of a RF filter. The RF filter has a half-lattice filter structure that includes a first and a second signal path 140, 150 coupled between a port 101 and another port 102. Signal path 140 includes one micro-acoustic resonator 141. Signal path 150 includes a series connection of another micro-acoustic resonator 151 and a phase shifter 152. The resonators 141, 151 may be surface acoustic wave resonators or bulk acoustic wave resonators wherein resonators 141, 151 may be of the same type or of a different type of resonators. The phase shifter 152 provides a phase shift of about 180° or of 180°. The phase shifter 152 may have a phase shift of 180° at least once during the passband of the depicted RF filter. Accordingly, phase shifter 152 may exhibit one or more frequencies at which its phase shift for that frequency is 180°. At other frequencies within the passband of the RF filter, the phase shift may be close to 180° or can also differ significantly from that, since the phase-slope depends on the selected phase-shifter realization. The phase shift of 180° may occur close to the center frequency of the passband or close to the center frequency.

The passband of the RF filter of FIG. 1 is determined by the resonance frequencies of the resonators 141, 151. For example, micro-acoustic resonator 141 may have a lower resonance frequency than micro-acoustic resonator 151. The passband of the RF filter has a lower passband corner approximately at the resonance frequency of resonator 141 and an upper passband corner approximately at the resonance frequency of resonator 151. It is to be noted that the width of the passband of the RF filter is not dependent on the coupling the piezoelectric material of the resonators to which the distance between the resonance and anti-resonance frequencies of the resonators is related, which is the case in conventional filters based on a ladder-type structure. In contrast, the filter bandwidth of a half-lattice type filter structure is determined by the resonance frequencies of the resonators used in the first and second signal paths. Accordingly, it is possible to form a filter of a large passband bandwidth using resonators having a correspondingly large difference between their resonance frequencies. The first and second signal paths 140, 150 including resonators 141, 151 and phase shifter 152 form a half-lattice type unit cell.

The phase shifter may be disposed in either one of the signal paths 140, 150. While FIG. 1 shows phase shifter 152 in signal path 150, it is also possible to insert the phase shifter 152 in signal path 140 connected in series with resonator 141. For practical reasons, it is useful to include the 180° phase shifter in that signal path that includes the resonator that has the lower resonance frequency. In that case, the phase shifter is connected to that resonator that has the resonance frequency at approximately the lower passband corner. Furthermore, as another alternative, the phase shifter can be positioned between port 101 and one of the resonators 141, 151.

Figure 2:
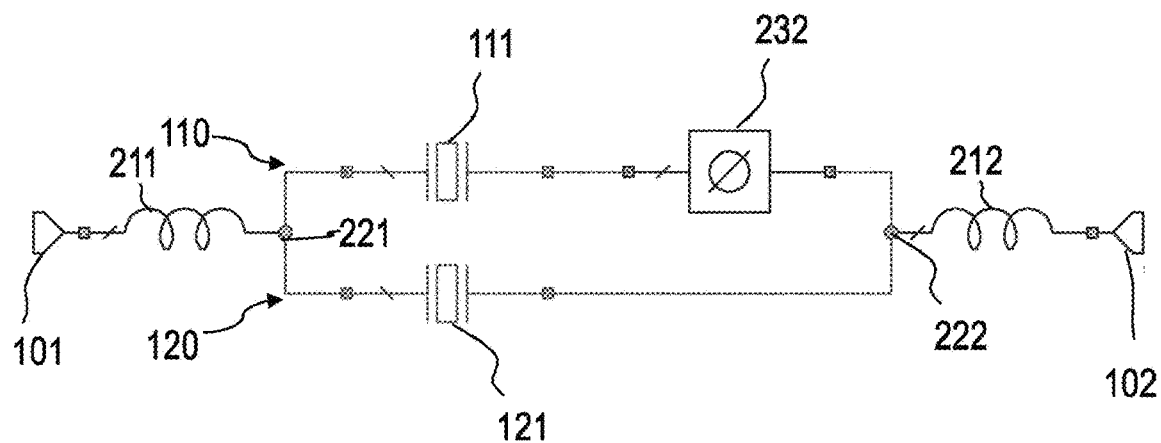
FIG. 2 shows a schematic diagram of a RF filter of the half-lattice type using matching circuits.

FIG. 2 shows another embodiment of a RF filter. Phase shifter 232 is connected to the resonator in that has the lower resonance frequency when compared to resonator 121. The first and second signal paths 110, 120 including resonators 111, 121 and phase shifter 232 form another embodiment of the half-lattice type unit cell. Furthermore, matching elements are connected between the first and second signal paths 110, 120 and the input/output ports 101, 102. A series connected inductor or coil 211 is connected between port 101 and node 221 that combines the first and second signal paths 110, 120. A series connected inductor or coil 212 is connected between port 102 and another node 122 coupling the first and second signal paths 110, 120. Inductors 111, 212 match the unit cell to achieve a desired passband performance. The matching circuits 211, 212 achieve a relatively flat upper portion of the passband. The shown example is a relatively simple form of a matching circuit. More complex ones are useful as well.

In case the micro-acoustic resonator offers spurious modes and/or other losses above the resonance frequency, the particular resonator forming the lower passband corner such as resonator 111 can be replaced by a capacitor. This lowers the left skirt steepness on the benefit of having a spurious-mode free passband. If bulk-acoustic wave resonators are used, then the application of different physical realizations can be advantageous. BAW resonators (SMR-BAW, FBAR) offering type-II dispersion do have spurious modes below the series resonance frequency, thus making them an attractive solution to be used for resonator 111, since this resonator is responsible for the lower passband corner of the filter. BAW resonators (SMR-BAW, FBAR) offering type-I dispersion do have spurious modes above the resonance frequency, thus making them an attractive solution to be used for resonator 121, since this resonator is responsible for the upper passband corner of the filter. Resonator 111 has a resonance frequency lower than the resonance frequency of resonator 121. Resonator 111 is responsible for the lower passband corner and resonator 121 is responsible for the upper passband corner. Phase shifter 232 is connected to resonator 121 in the embodiment depicted in FIG. 2 so that phase shifter 232 is connected to that resonator that is responsible for the lower passband corner. In this case, resonator 121 may be realized by a micro-acoustic resonator such as a BAW resonator or, alternatively, as a capacitor.

Figure 3:
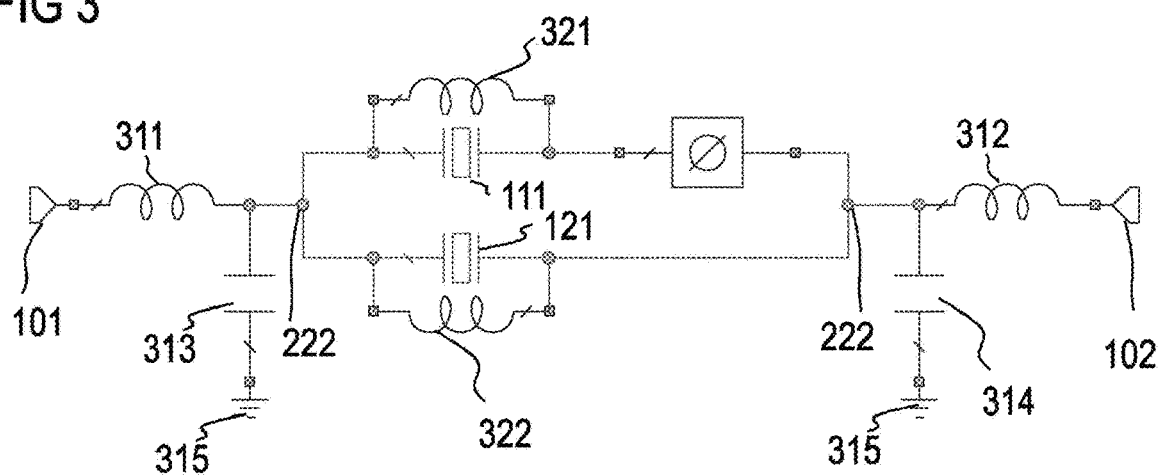
FIG. 3 shows a schematic diagram of a RF filter of the half-lattice type using other matching circuits.

FIG. 3 shows yet another embodiment of a RF filter including other possibilities for matching the filter passband performance. The RF filter of FIG. 3 includes inductors 321, 322 each connected in parallel to resonators 111 and 121, respectively. Furthermore, at the side of port 101, a series inductor 311 and a shunt or parallel connected capacitor 313 are provided for additional matching purposes. Capacitor 313 is connected between node 221 and terminal 315 for ground potential. At node 102, a series connected inductor 312 is connected between port 102 and node 222. Node 222 is furthermore connected to terminal 315 for ground potential through capacitor 314. Either one of inductors 211, 212 (FIG. 2) or low pass type circuits 311, 313, 312, 314 or shunt/parallel connected inductors 321, 322 (FIG. 3) may be used alone or in combination with any of the other elements to achieve a desired matching of the passband of the RF filter. Other matching circuits (Highpass) are allowed, too.

Figure 4:
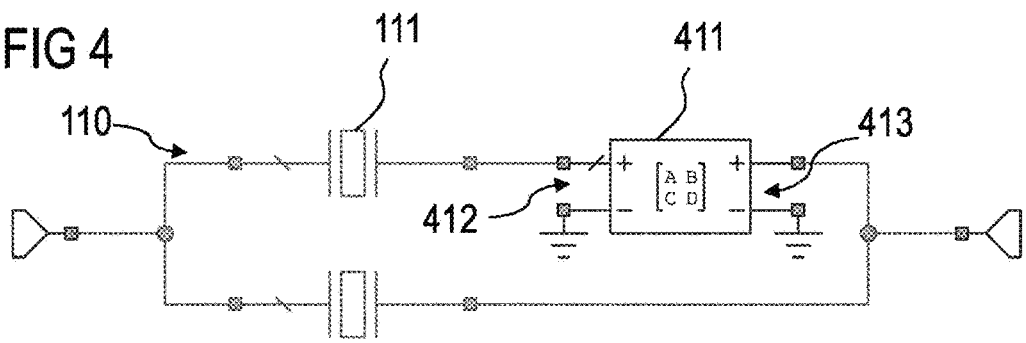
FIG. 4 shows a RF filter including a principle realization of a phase shifter.

FIG. 4 shows an embodiment of a RF filter showing a generalized two-port device 411 representing the phase shifter. Device 411 comprises two ports 412, 413 that can be described by a chain matrix [■(A&B@C&D)]. One terminal of ports 412, 413 is connected to ground potential. Another terminal is connected into the signal path no wherein a phase shift of about 180° is generated between said terminals. The phase shift is such that it occurs at least once at 180° within the passband of the filter.

Figure 5A:
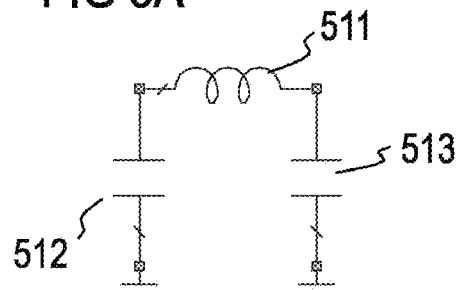
FIGS. 5A through 5I show circuit diagrams of several embodiments for the phase shifter of FIG. 4.
Figure 5B:
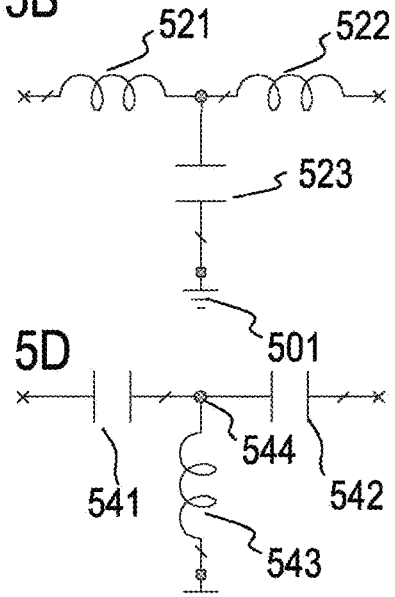
Figure 5C:
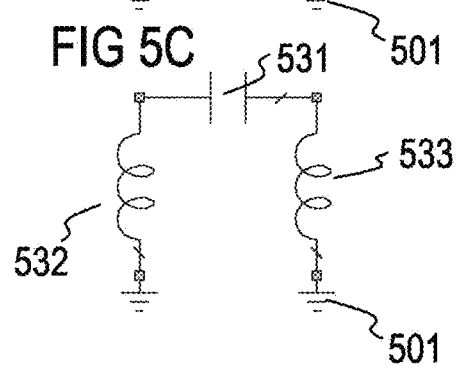
Figure 5D:
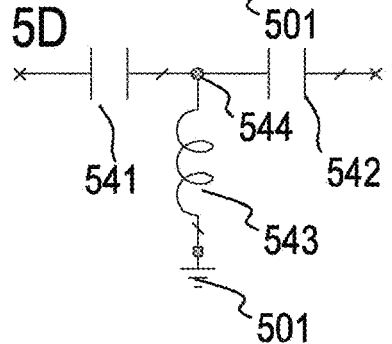
Figure 5E:
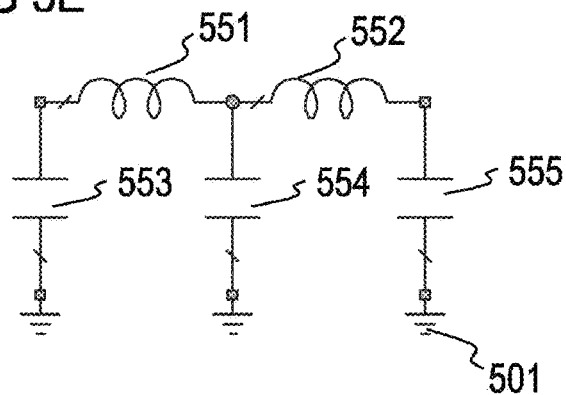
Figure 5F:
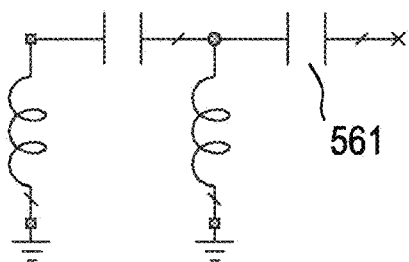
Figure 5G:
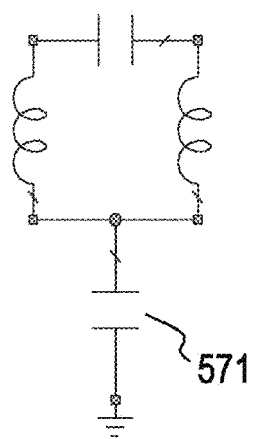
Figure 5H:
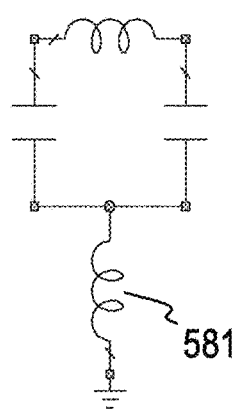
Figure 5I:
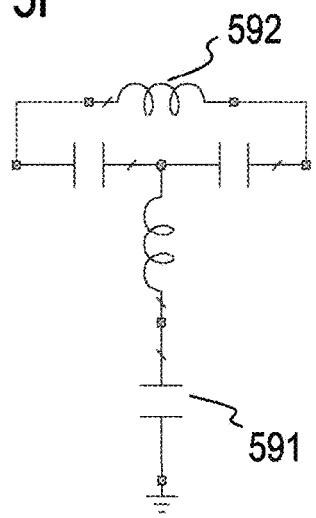

FIGS. 5A through 5I show various embodiments for the two-port phase shifter device 411. Turning now to FIG. 5A, a low pass Pi circuit is shown comprising an inductor 511 of which the inductor terminals are connected to terminal 501 for ground potential through corresponding capacitors 512, 513. Turning now to FIG. 5B, a low pass Tee circuit is shown. The low pass Tee circuit comprises two series connected inductors 521, 522, wherein node 524 coupling inductors 521, 522 is connected to ground terminal 501 through shunt connected capacitor 523. Turning now to FIG. 5C a high pass Pi circuit is shown. The high pass Pi circuit comprises a series connected capacitor 531 of which the capacitor terminals are connected to ground terminal 501 through shunt connected inductors 532, 533. Turning now to FIG. 5D, a high pass Tee circuit is shown. The high pass Tee circuit comprises series connected capacitors 541, 542, wherein node 544 coupling capacitors 541, 542 is connected to ground terminal 501 through shunt connected inductor 543. Turning now to FIG. 5E, a second order cascade of two cascaded low pass Pi circuits is shown. The cascaded low pass Pi circuit comprises two low pass Pi circuits of FIG. 5A in cascaded configuration. The circuit depicted in FIG. 5E comprises the series connection of two inductors 551, 552 wherein the terminals of the inductors 551, 552 are connected to ground terminal 501 through shunt connected capacitors 553, 554, 555. The inner two capacitors of the cascaded low pass Pi elements are condensed to one capacitor such as capacitor 554. FIG. 5F shows a 4-element high pass as an example for a phase-shifter having more than three elements, but still based on one of the four basic phase shifter units as shown in FIGS. 5A to 5D. The phase shifter of FIG. 5F is based on the high pass Pi circuit of FIG. 5C further comprising a serial capacitor 561. The circuits of FIGS. 5G and 5H show basic unit cells forming an allpass, which offers an almost flat passband, but only shaping the phase properties which forms an allpass. The circuits of FIGS. 5G and 5H are based on high pass Pi and low pass Pi circuits further comprising a parallel connected capacitor 571 and inductor 581, resp. FIG. 5I shows an example of an equalizer circuit in a bridged-T form based on a high pass Tee circuit wherein an inductor 592 is connected in parallel to the serial capacitors and a parallel connected capacitor 591 is provided.

Any one of the above-mentioned circuits shown in FIGS. 5A through 5I may be used to realize the two-port phase shifter device 411 of FIG. 4. Two or more of said phase shifter circuits of FIGS. 5A through 5I can be cascaded to form a phase shifter of a second or higher order depending on the desired performance of the RF filter. A higher order phase shifter may have a better broadband performance of the phase shifter which improves the S21-parameter of the RF filter. The cascading of the circuits of FIGS. 5A to 5D is equivalent to offer more than three elements. As an example, the circuit of FIG. 5F is an extension of the circuit of FIG. 5C by adding one additional series capacitance 561.

Figure 6:
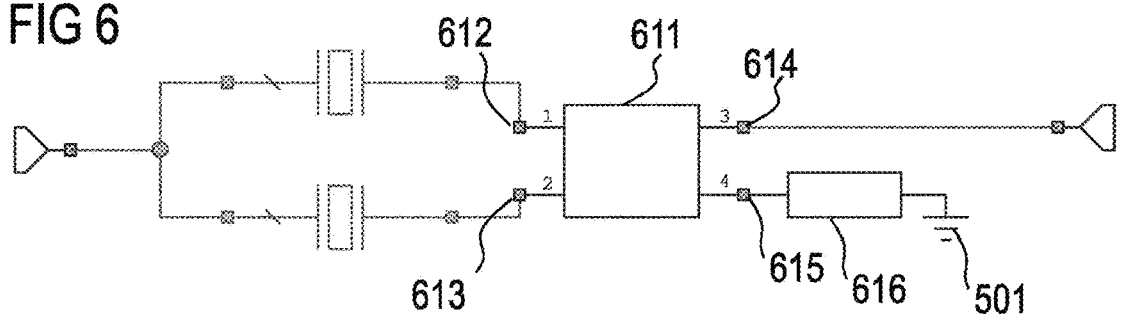
FIG. 6 shows a RF filter including a principle diagram of yet another embodiment of a phase shifter.

FIG. 6 depicts a RF filter including a phase shifter device 611 realized as a four-port circuit having ports 612, 613, 614, 615. Port 615 may be connected to ground terminal 501 through a termination device 616 such as a resistor. The resistor 616 may be omitted so that port 615 is directly connected to ground terminal 501. Element 616 can also be a complex impedance. Alternatively, three-port devices may be used that include ports 612, . . . , 614 and omit port 615. Circuit 611 establishes a phase shift of 180° between ports 612 and 613.

Several examples are available to realize circuit 611. For example, circuit 611 may be realized as a balun circuit which converts a balanced signal (two signal lines comprising a 0° signal line and a 180° signal line, both referenced to ground potential GND) to a single-ended signal (one signal line, e.g. 0° signal referenced to ground potential GND). A balun circuit can also be achieved using a 0°/90° 3 dB-hybrid circuit plus an additional phase shifter of 90°. 3 dB hybrids can be used if circuitry around the RF filter has already quadrature hybrid circuits involved so that the phase shifter 611 can use such circuits already present in other circuits available on the circuit board. This may be the case with power amplifier circuits. Other possibilities may use the transition from low pass to high pass which includes a phase shift of 180° wherein a power divider such as a 3 dB Wilkinson power divider may be added. Possible realizations for circuit 611 employing one or more of the above-mentioned concepts are described in more detail herein below.

Figure 7:
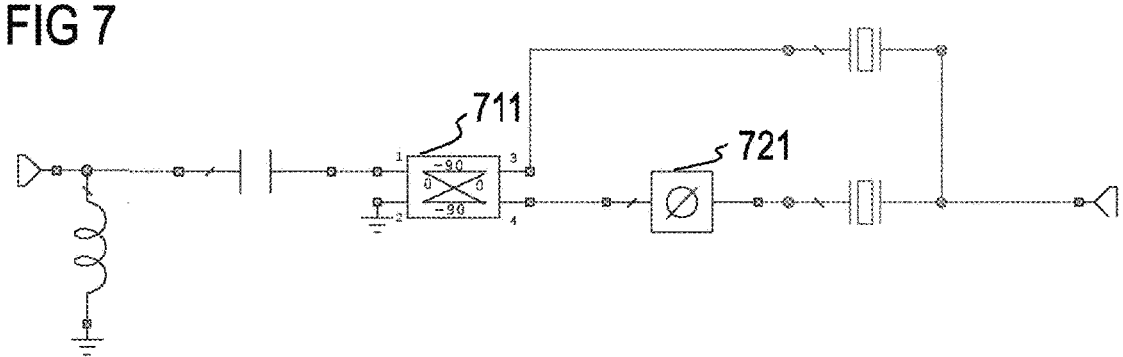
FIG. 7 shows a RF filter including yet another embodiment of a phase shifter.

FIG. 7 shows a RF filter using a 3 dB-0°/90°-hybrid circuit 711. Circuit 711 generates a phase shift of 90° between its terminals 1-4 so that an additional phase shifter 721 is required to achieve an overall phase shift of 180°.

Phase shifter 721 performs at least one 90° phase shift within the passband of the depicted RF filter. As an alternative embodiment (not shown) circuit 711 may be realized as a 180° hybrid such as a balun circuit so that 90°-phase shifter 721 can be omitted.

Figure 8:
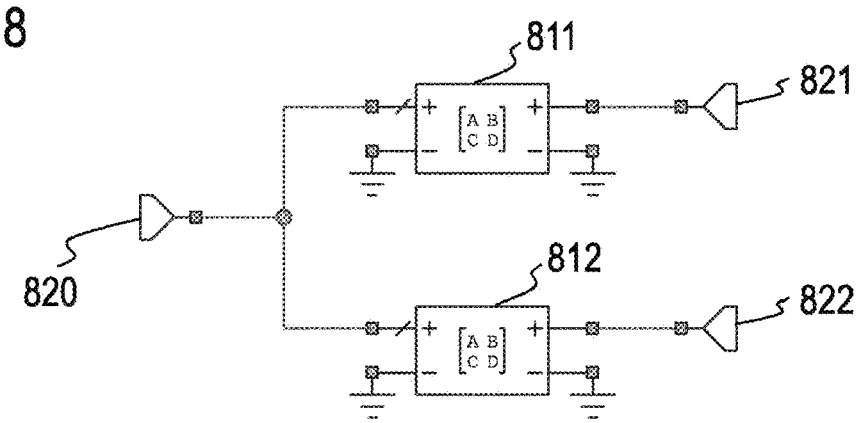
FIG. 8 shows a principle diagram of yet another embodiment of a phase shifter.

FIG. 8 shows another realization for circuit 611 of FIG. 6. The circuit in FIG. 8 includes a port 820 to which two chain matrix circuits 811, 812 having different chain matrices [■(A&B@C&D)] are connected that are coupled to separated ports 821, 822. A phase shift of about 180° is provided between the ports 821 and 822. Circuit 811 may be realized as a low pass filter and circuit 812 may be realized as a high pass filter so that a phase shift of 180° can be achieved between ports 821, 822.

Figure 9A:
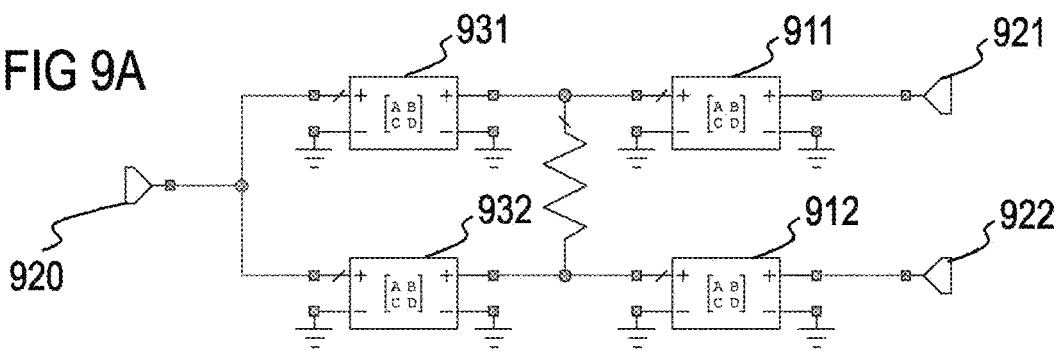
FIGS. 9A and 9B show a principle diagram of yet another embodiment of a phase shifter and a corresponding schematic diagram of the phase shifter.
Figure 9B:
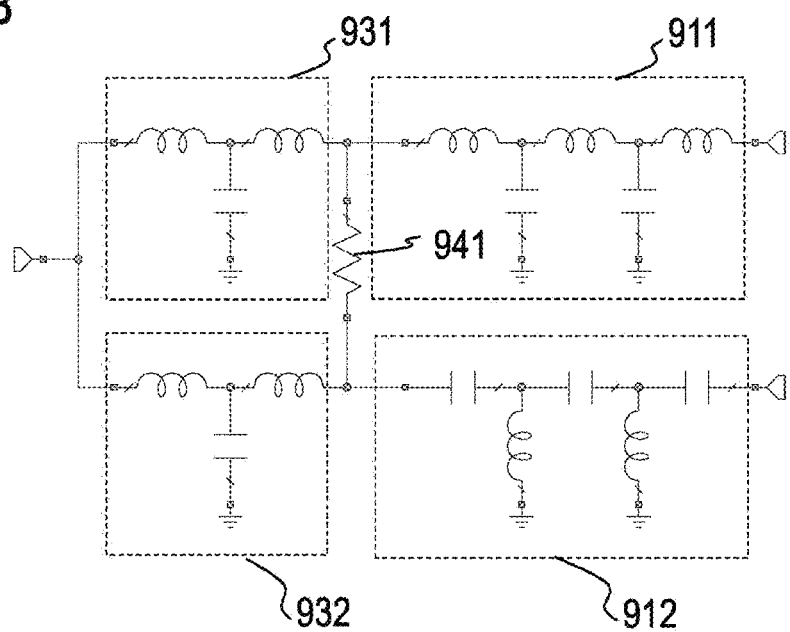

The circuits shown in FIGS. 9A and 9B are other examples further detailing the concept depicted in FIG. 8. FIG. 9A includes a power divider 931, 932 represented by corresponding [■(A&B@C&D)] matrix devices coupled to port 920. Power dividers 931, 932 such as Wilkinson power dividers may be realized as 3 dB power split devices. A low pass filter 911 is provided in one of the split signal paths and high pass filter 912 is provided in the other split signal path. Output ports 921, 922 connected to low pass and high pass filters 911, 912 exhibit a 180° phase shift there between.

FIG. 9B shows a schematic circuit realization of the general phase shifter concept of FIG. 9A. The power dividers 931, 932 are realized by low pass Tee circuits including two series connected inductors and one shunt connected capacitor coupled to the node between the two inductors. Low pass circuit 911 includes several series connected inductors wherein the nodes between the inductors are coupled to ground potential through shunt connected capacitors. High pass filter 912 includes at least three series connected capacitors, wherein the nodes between the capacitors are connected to ground potential through shunt connected inductors. Resistor 941 is used to match the signal lines as required by the Wilkinson power divider circuitry.

Even other realizations for the phase shifter 611 of FIG. 6 are possible such as an all pass filter which generates a phase shift of 180°. A Marchand-balun may also be used, which includes a transmission line that achieves a broadband balun operation. A Marchand-balun, however, may be large in size.

Figure 10:
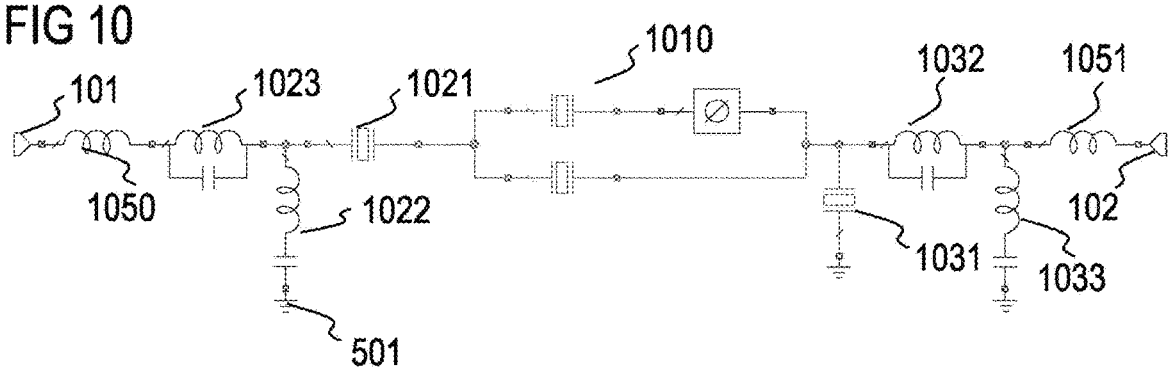
FIG. 10 shows a schematic diagram of a RF filter using finite transmission zero circuits.
Figure 11:
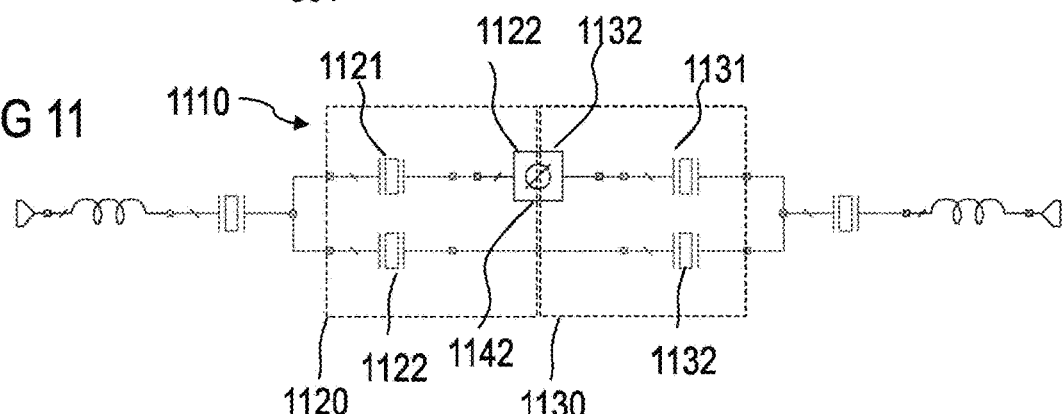
FIG. 11 shows a schematic diagram of a RF filter with a cascaded half-lattice structure.

FIG. 10 shows a RF circuit including several possibilities for elements performing a finite transmission zero function. In general a finite transmission zero (FTZ) circuit element can be used to shape the filter performance at the skirts of the passband and in the region of the stopband that is outside of the passband. FTZ elements may be used to insert transmission poles at a certain frequency location and/or render the skirts steeper. The FTZ elements can be added between the half-lattice unit and the input/output ports. When compared to conventional filter structures such as ladder-type filters, the FTZ elements can shape the filter performance rather independently from the half-lattice unit and the passband of the RF filter. The filter designer can choose the number of FTZ elements and the types of FTZ elements relatively freely based on the circuit requirements. The circuit in FIG. 10 shows several possibilities of FTZ elements in one circuit. It is to be noted that, based on performance requirements, one or more of the shown elements can be omitted.

In the central portion of the RF filter of FIG. 10, the half-lattice unit 1010 is shown. At the left-hand side to the half-lattice unit 1010, a FTZ resonator 1021 is serially connected between terminal 101 and half-lattice unit 1010. A shunt connected series resonant element 1022 is connected between micro-acoustic resonator 1021 and ground potential 501. A series connected parallel resonant circuit 1023 is connected serially between port 101 and resonator 1021. Series inductor 1050 represents a matching inductor. On the right-hand side to the half-lattice unit 1010, a shunt connected micro-acoustic resonator 1031 is provided connected between unit 1010 and ground potential. A series connected parallel resonant circuit 1032 is connected between unit 1010 and port 102. A shunt connected series resonant circuit 1033 is connected between parallel resonant circuit 1032 and ground potential. Inductor 1051 represents the matching circuit connected directly to port 102. As shown in FIG. 10, one of the FTZ circuits can be connected in series wherein the finite transmission zero function of that resonator is determined by the anti-resonance frequency of that resonator. Another one of the FTZ circuits can be connected in shunt or in parallel wherein the finite transmission zero function of that resonator is determined by the series resonance frequency of that resonator. The FTZ circuits can also be connected in a combination of series and shunt like in a ladder. The number of FTZ circuits is theoretically not limited so that the designer can place as many FTZ circuits as required by the specification of the RF filter. It is also possible to connect FTZ only in series or only in shunt as shown in FIG. 12A.

In general, the passband operation of the RF filter is mainly determined by the half-lattice unit 1010 including the matching circuits, and the out-of-band performance is mainly determined by the FTZ elements and the selection of the phase-shifter topology, wherein both passband and out-of-band functions can be designed relatively independently and freely from each other using the concepts described in connection with FIG. 10. This ability is different to conventional ladder-type filters. The FTZ elements can be realized with micro-acoustic resonators such as resonators 1021, 1031. If the FTZ is too high or too low in frequency, it can be realized with LC resonance circuits connected to the unit 1010. When the frequency spread of the resonance frequencies of the FTZ elements is too wide so that individual resonators cannot be realized on one chip anymore, multiple micro-acoustic chips can be used or some of the FTZ resonators can be realized in substrate-based technology such as low temperature co-fired ceramic (LTCC), laminate, high temperature co-fired ceramic (HTCC), passives-on-glass (POG) or integrated passive devices (IPD).

Figure ii shows a RF filter that includes a cascaded half-lattice unit cell 1110. The second order cascaded half-lattice unit cell 1110 includes two cascaded first order half-lattice unit cells 1120, 1130. The first unit cell 1120 includes resonators 1121, 1122 in first and second signal paths and a 180° phase shifter 1122. The second unit cell 1130 includes resonators 1131, 1132 within the first and second signal paths and 180° phase shifter 1132 belonging to said unit cell. The phase shifters 1122, 1132 from both unit cells 1120, 1130 are combined to one single phase shifter 1142 as depicted. Careful design allows to design a circuit, that still offers an approximately 180° phase-shift element 1142 in combination with the four resonators 1121, 1131, 1122, and 1132. Additional unit cells (not shown) can be cascaded also. The number of phase shifters needed is basically half of the number of cascaded unit cells. That is that in the non-cascaded case, one unit cell requires one phase shifter. When two unit cells are cascaded, still one phase shifter is needed. When three unit cells are cascaded, two phase shifters are needed. When four unit cells are cascaded, two phase shifters are needed, etc. The properties of the individual resonators 1121, 1131, 1122, and 1132 can be different. It is also possible to replace (as described before) one or more resonators by capacitors in case the losses and/or spurious modes affect the passband too massively.

Figure 12A:
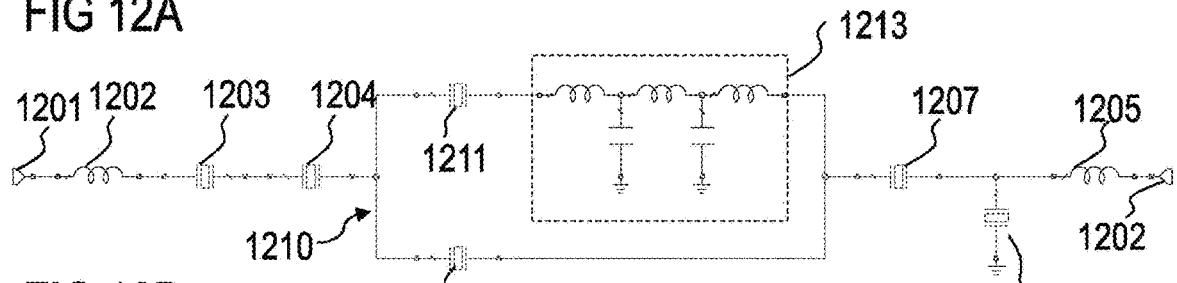
FIGS. 12A and 12B show a schematic diagram of a RF filter for the n79-band and the corresponding transmission function.
Figure 12B:
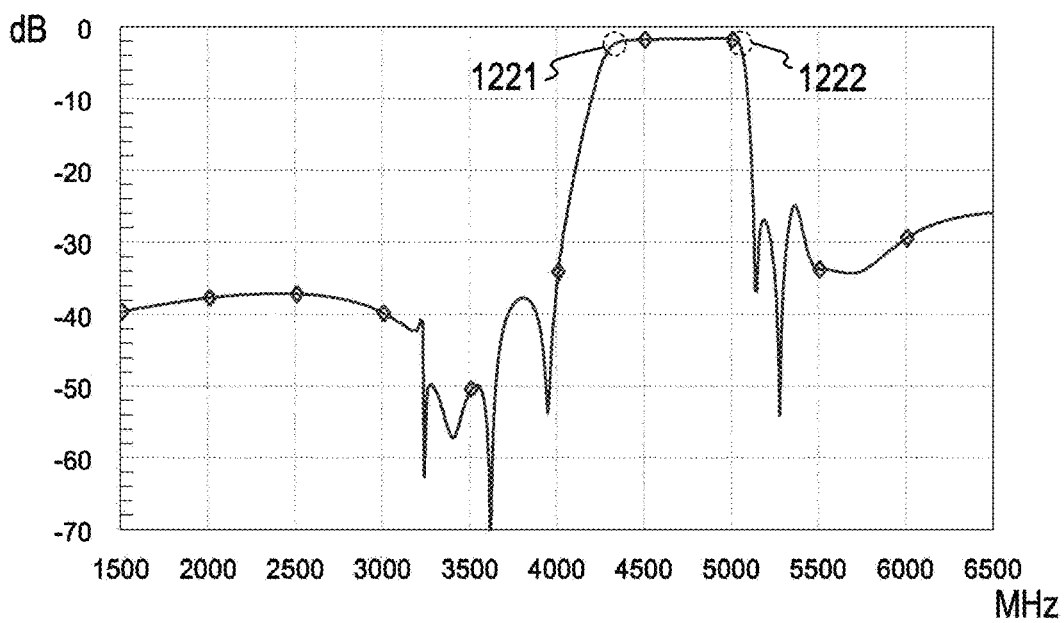

FIGS. 12A, 12B show a detailed circuit representation of an exemplary n79-filter for 5G communication services and the corresponding transmission function. The basic unit cell of the n79-filter comprises resonators 1211 and 1212 in half-lattice type fashion. A phase shifter 1213 is connected serially to resonator 1211. The phase shifter 1213 is realized as a second order low pass Tee circuit in analogy to FIG. 5B. Also a second order high pass Tee circuit in analogy to FIG. 5D or a circuit in analogy to FIG. 5F are useful. Port 1201 is connected through the series connection of matching inductor 1202 and micro-acoustic resonators 1203, 1204 forming two FTZ to the unit cell 1210. The other port 1202 is connected to the unit cell 1210 through matching inductor 1205, shunt connected FTZ micro-acoustic resonator 1206 and series connected FTZ resonator 1207. FIG. 12B shows the transmission function of the filter of FIG. 12A. The graph shows a passband between 4.4 GHz and 5.0 GHz which has a relatively flat top shape of the passband. The passband spans between the lower passband corner 1221 and the upper passband corner 1222. To the right-hand side of the passband that is beyond the upper skirt of the passband and the upper passband corner 1222, a sufficient attenuation is provided to suppress WLAN services located in that frequency range.

It is to be noted that the matching circuits connected to the input/output ports 1201, 1202 may be configured rather freely so that an impedance transformation can be performed from one impedance level to a substantially different other impedance level. For example, the impedance to be provided at port 1201 may be 50 Ohm and the impedance to be provided at port 1202 may be 200 Ohm. In this case, the matching inductor 1205 must be reconfigured to achieve an impedance of 200 Ohm (not shown in FIG. 12A) which can easily be achieved by a skilled circuit designer. Since the filter passband is achieved by the half-lattice unit 1210, the circuit designer is relatively free to dimension the impedance of the input/output port to the desired level. Specifically, the impedance at one port may be transformed to another substantially different impedance at the other port, wherein the S21-parameter of the resulting filter remains almost at the same level which is almost unchanged.

Figure 13:
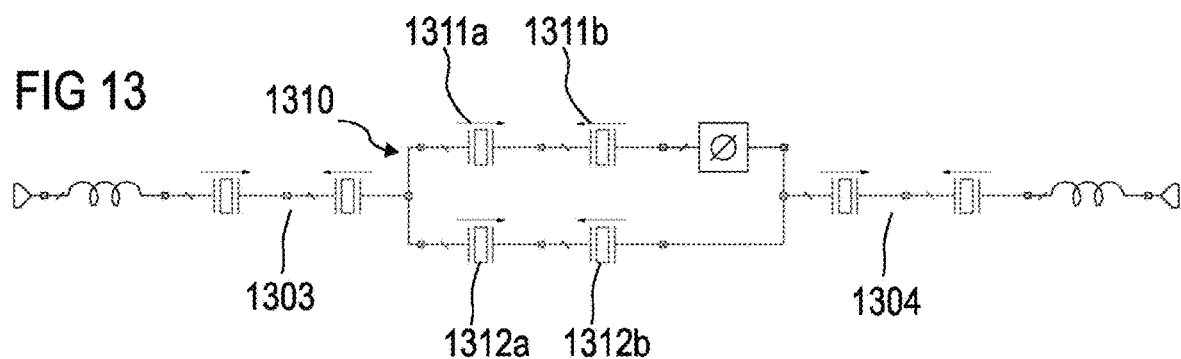
FIG. 13 shows a schematic diagram of a RF filter using anti-series cascades.

FIG. 13 shows a schematic diagram of a RF filter circuit in which resonators are cascaded in anti-series cascading fashion to improve linearity, for example. In the half-lattice unit cell 1310, resonators 1311a, 1311b are connected serially wherein the polarity of the piezoelectric material included in said resonators has anti-serial orientation depicted with corresponding arrows. The arrow of resonator 1311a shows from left to right, the arrow of resonator 1311b shows from right to left, that is in opposite direction when compared to resonator 1311a. In practice, the opposite polarity orientation of the piezoelectric material can be easily selected during the fabrication of said resonators. When a signal propagates through the circuit from resonator 1311a to resonator 1311b, the signal experiences opposite polarity of the piezoelectric materials so that a contraction of the piezoelectric material in resonator 1311a occurs at the same time as an expansion of the piezoelectric material of the resonator 1311b and vice versa. The same principle of anti-series cascading of resonators has been applied to the FTZ elements 1303 and 1304.

As another possibility (not shown in FIG. 13), resonators can be combined in anti-parallel cascading fashion, wherein the orientation of the piezoelectric material of one resonator is opposite to the orientation of the piezoelectric material of the other resonator in that parallel connection of resonators. While the circuit of FIG. 13 shows a first order anti-series cascading of resonators, second and higher orders of anti-series and anti-parallel cascading of resonators is also possible. An anti-series or anti-parallel resonator cascading scheme may be applied to improve the linearity of the filter. Improved linearity increases the filter performance and reduces the distortions in the filter signal. Resonator cascading increases also the active area of the resonators so that the filter can handle more power so that the power durability of the filter is increased.

Figure 14:
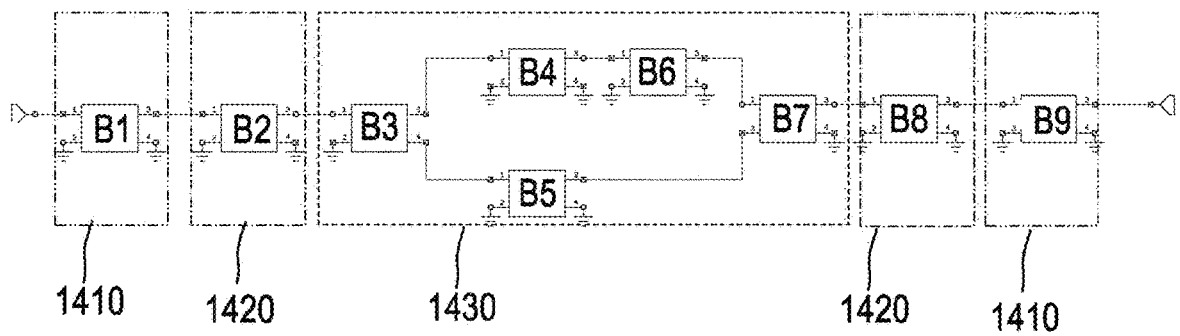
FIG. 14 shows a schematic diagram of the RF filter illustrating the partitioning of the elements of the filter.

FIG. 14 shows the partitioning of the devices within the filter with regard to manufacturing technologies. In general, substrate-based technologies and micro-acoustic resonator technologies are available. Substrate-based technologies include low temperature co-fired ceramics, laminate, high temperature co-fired ceramics, passives-on-glass (POG), integrated passive devices (IPD). Micro-acoustic resonator technologies include thin-film surface acoustic wave resonators, bulk acoustic wave resonators, substrates such as lithium tantalate ($LiTaO_3$) with different cut angles such as 42°, lithium niobate ($LiNbO_3$), aluminum scandium nitride (AlScN), aluminum nitride (AlN), or any other piezoelectric material. High Q temperature-compensated filters (HQTCF) are also possible. Lamb-wave resonators (SAW on AlN or AlScN), ThinFilm-SAW, or other micro-acoustic resonator technologies can be used for this particular filter design concept.

The elements close to the input/output ports such as elements B1, B9 may be realized as lumped elements using discrete devices such as inductors and/or capacitors to realize the matching network. Also a combination of one of the substrate-based technologies with the lumped elements may be possible. Accordingly, elements B1, B9 may be realized on a circuit substrate 1410. The elements B2, B8 may be FTZ elements having a resonance frequency far away from the passband of the RF filter so that they may be realized as one micro-acoustic chip 1420. Alternatively, they may be realized within a substrate-based technology. The FTZ elements B3, B7 have resonance frequencies assumed to be close to the passband of the RF filter so that they may be realized on another micro-acoustic chip 1430, different from chip 1420. The resonators B4, B5 as well as the phase shifter B6 determine the passband of the filter so that they are realized also on chip 1430 together with the close-by FTZ elements B3, B7. It is to be noted that capacitors of the faraway FTZ elements B2, B8 may be realized on the micro-acoustic chip 1430 together with the close-by elements. Also, capacitors useful for realizing the phase shifter B6 may be placed on the micro-acoustic chip 1430. In case spurious modes affect the passband of the filter, resonator B4 can be realized by a capacitor. In case bulk-acoustic wave devices are used, then resonator B4 can be realized by a resonator offering dispersion type-II, and resonator B5 can be realized by a resonator offering dispersion type-I. In case the used manufacturing technology does not allow to realize resonators B4 and B5 on the same chip, they can be realized also on different chips. In particular this is the case, if a mix of resonator technologies is used.

In an embodiment, resonator B4 has a lower resonance frequency than resonator B5 so that resonator B4 is responsible for the lower passband corner 1221 and resonator B5 is responsible for the upper passband corner 1222. Resonator B4 may be realized by a resonator technology such as a BAW technology that provides losses and/or spurious modes below the resonance frequency of resonator B4. Resonator B5 may be realized by another resonator technology such as another BAW technology that provides losses and/or spurious modes above the resonance frequency of resonator B5.

In conclusion, conventional ladder-type topologies cannot provide suitable solutions for next generation filters such as 5G communication services since the available piezoelectric materials may not allow the required broad bandwidth. A half-lattice unit cell approach achieves broad passband bandwidth and allows flexible optimization of passband and stopband performance. The half-lattice filter structure includes a 180° phase shifter for which various design approaches are available.

It will be apparent to those skilled in the art that various modifications and variations can be made without departing from the spirit or scope of the disclosure as laid down in the appended claims. Since modifications, combinations, sub-combinations and variations of the disclosed embodiments incorporating the spirit and substance of the disclosure may occur to the persons skilled in the art, the disclosure should be construed to include everything within the scope of the appended claims.

The invention claimed is:

1. A micro-acoustic RF filter, comprising:
a first port and a second port;
a first node coupled to the first port;
a second node coupled to the second port;
a first signal path coupled between the first node and the second node, the first signal path including a first resonator;
a second signal path coupled between the first node and the second node, the second signal path including a second resonator and a phase shifter connected in series to the second resonator, wherein at least one of the first resonator or the second resonator comprises a micro-acoustic resonator;
a third resonator, wherein the third resonator comprises an additional micro-acoustic resonator having a first end coupled directly to the second node and a second end coupled to a reference node; and
a fourth resonator having a first end coupled to the first port and a second end coupled directly to the first node,
wherein the third resonator and the fourth resonator are configured to provide a finite transmission zero (FTZ) function outside of a passband, and
wherein the first resonator, the second resonator, and the phase shifter configure a frequency response within the passband, and
wherein each of the first resonator, the second resonator, and the fourth resonator comprise a pair of resonators connected in anti-series having opposite polarities.

2. The micro-acoustic RF filter of claim 1, further comprising a series connected parallel resonant circuit coupled in series between the second node and the second port.

3. The micro-acoustic RF filter of claim 2, further comprising a shunt connected series resonant circuit having a first end and a second end;
wherein the series connected parallel resonant circuit comprises a first end coupled to the second node and a second end coupled to the first end of the shunt connected series resonant circuit; and
wherein the second end of the shunt connected series resonant circuit is coupled to the reference node.

4. The micro-acoustic RF filter of claim 3, further comprising an inductor having a first end coupled to the second end of the series connected parallel resonant circuit and a second end coupled to the second port.

5. The micro-acoustic RF filter of claim 1, further comprising a series connected parallel resonant circuit in series between the first port and the fourth resonator, wherein the series connected parallel resonant circuit has a second end coupled to the fourth resonator.

6. The micro-acoustic RF filter of claim 5, further comprising a shunt connected series resonant circuit coupled between the second end of the series connected parallel resonant circuit and the reference node.

7. The micro-acoustic RF filter of claim 6, further comprising an inductor coupled between the first port and the series connected parallel resonant circuit.

8. The micro-acoustic RF filter of claim 1, wherein the first resonator and the second resonator of the first signal path and the second signal path each exhibit a resonance frequency, wherein the resonance frequency of the second resonator of the second signal path is lower than the resonance frequency of the first resonator of the first signal path wherein the phase shifter is connected to the second resonator of the second signal path.

9. The micro-acoustic RF filter of claim 8, wherein the second resonator of the second signal path is realized by a micro-acoustic resonator technology providing losses and/or spurious modes below the resonance frequency of said second resonator and wherein the first resonator of the second signal path is realized by a micro-acoustic resonator technology providing losses and/or spurious modes above the resonance frequency of said first resonator.

10. The micro-acoustic RF filter of claim 1, wherein the micro-acoustic RF filter is configured to exhibit a passband having a lower passband corner and an upper passband corner, wherein the second resonator is configured to form the lower passband corner and the first resonator is configured to form the upper passband corner, and wherein the phase shifter is connected to the second resonator configured to form the lower passband corner.

11. The micro-acoustic RF filter of claim 10, wherein the second resonator is configured to form the lower passband corner comprises a bulk acoustic wave resonator exhibiting dispersion type II and the first resonator is configured to form the upper passband corner comprises a bulk acoustic wave resonator exhibiting dispersion type I.

12. The micro-acoustic RF filter of claim 1, wherein the phase shifter is configured to perform a phase shift of 180° at least once within a passband of the micro-acoustic RF filter.

13. The micro-acoustic RF filter of claim 1, wherein the phase shifter comprises at least one of: a highpass Pi circuit, a lowpass Pi circuit, an allpass circuit, or combinations thereof to realize phase-shifters consisting of at least three elements disposed in the second signal path.

14. The micro-acoustic RF filter of claim 1, further comprising a matching circuit connected between at least one of the first port and the second port or the first signal path and the second signal path to provide passband matching.

15. The micro-acoustic RF filter of claim 1, further comprising at least one or more of a micro-acoustic resonator and a parallel resonance circuit connected in series between the first signal path and the second signal path and one of the first port or the second port to perform a finite transmission zero function.

16. The micro-acoustic RF filter of claim 1, further comprising at least one or more of a micro-acoustic resonator and a series resonance circuit connected in shunt to a node coupled between the first signal path and the second signal path and a terminal for ground potential to perform a finite transmission zero function.

17. The micro-acoustic RF filter of claim 1, wherein at least one additional resonator is cascaded in each one of the first signal path and the second signal path.

18. The micro-acoustic RF filter of claim 1, wherein the micro-acoustic RF filter is configured to exhibit a passband portion and an out-of-band portion, wherein the passband portion is in an n79 band or between 4.4 GHz and 5.0 GHz and the out-of-band portion is out of the n79 band or in a frequency range of less than 4.4 GHz and more than 5.0 GHz, wherein the first resonator and the second resonator are surface acoustic wave or bulk acoustic wave resonators comprising a piezoelectric substrate of at least one of lithium tantalate, lithium niobate, or aluminum scandium nitride.

19. The micro-acoustic RF filter of claim 1, wherein the third resonator is a FTZ resonator.

20. The micro-acoustic RF filter of claim 1, further comprising a FTZ filter coupled to the first port and the second port, wherein the FTZ filter comprises the third resonator.

* * * * *